United States Patent [19]

Iwamuro

[11] Patent Number: 5,072,265

[45] Date of Patent: Dec. 10, 1991

[54] P-CHANNEL INSULATION GATE TYPE BIPOLAR TRANSISTOR

[75] Inventor: Nuriyuki Iwamuro, Kanagawa, Japan

[73] Assignee: Fuji Electric Co., Ltd., Kawasaki, Japan

[21] Appl. No.: 645,204

[22] Filed: Jan. 24, 1991

Related U.S. Application Data

[63] Continuation-in-part of Ser. No. 472,627, Jan. 30, 1990, abandoned.

[30] Foreign Application Priority Data

Jan. 30, 1989 [JP] Japan .................................. 1-20364
Dec. 19, 1989 [JP] Japan .................................. 1-328770

[51] Int. Cl.$^5$ ..................... H01L 29/10; H01L 29/78
[52] U.S. Cl. .................................. 357/23.4; 357/23.8; 357/37; 357/38; 357/13; 357/86
[58] Field of Search ..................... 357/23.4, 23.8, 38, 357/13, 37, 34, 38 E, 38 G, 86

[56] References Cited

U.S. PATENT DOCUMENTS

| 4,364,073 | 12/1982 | Becke et al. | 357/38 X |
| 4,502,070 | 2/1985 | Leipold et al. | 357/38 |
| 4,684,413 | 8/1987 | Goodman et al. | 357/38 X |

OTHER PUBLICATIONS

High-Power Conductivity-Modulated FET's (COM-FET's) with a p-Type Channel; IEEE Electron Device Letters, vol. EDL-5, No. 11, Nov. 1984; J. P. Russell et al., pp. 437-439.

Primary Examiner—Andrew J. James
Assistant Examiner—Sara W. Crane
Attorney, Agent, or Firm—Brumbaugh, Graves, Donohue & Raymond

[57] ABSTRACT

A p-channel insulation gate type bipolar transistor, wherein the thickness and specific resistivity of the p$^+$ layer and p$^-$ layer, respectively, are constrained so as to avoid avalanche breakdown when a load L is turned off.

5 Claims, 4 Drawing Sheets

P-CHANNEL INSULATION GATE TYPE BIPOLAR TRANSISTOR

BACKGROUND OF THE INVENTION

The present application is a continuation-in-part of U.S. patent application Ser. No. 07/472,627 filed Jan. 30, 1990, now abandoned.

The present invention relates to a p-channel insulation gate type bipolar transistor for supplying a base current of an npn bipolar transistor by a p-channel MOSFET.

N-channel insulation gate type bipolar transistors (IGBTs) are generally used as power switching elements. As an example, a p+ layer may be added to the electrode side of the drain region of an n-channel vertical type MOSFET. However, in recent years, p-channel type IGBTs have been under development since it is possible to simplify and easily form the control circuit in the p-channel type IGBT. The p-channel type IGBT is similar to the n-channel type IGBT, except all of the conductive types in the n-channel type IGBT are reversed.

That is, as shown in the IGBT of FIG. 1, a p+ layer 2, utilized as a buffer layer, is formed on an n+ substrate 1, a p− layer 3 of high resistance is formed on the surface thereof, an n+ layer 4 (the first region) is formed selectively on the p+ layer 3, and a p+ layer 5 (the second region) is selectively formed on the n+ layer 4. Further, the surface region of this n+ layer 4 is disposed between the p− layer 3 and the p+ layer 5 as a channel region, and a gate electrode 7 is formed thereon via a gate insulating film 6. Then, a source electrode 8 is in contact with the n+ layer 4 and p+ layer 5, and a drain electrode 9 is in contact with the surface of the n+ substrate 1. An interlayer insulation film 10 is disposed between the source electrode 8 and the gate electrode.

In this element, when the source electrode 8 is grounded to earth, and a negative voltage is applied to the gate electrode 7 and the drain electrode 9, the MOSFET is turned on, and positive holes flow into the p− layer 3. Correspondingly, injection of electrons occurs from the n+ substrate 1 to the p− layer 3, and at the p− layer 3, the resistance of this region becomes low, due to the occurrence of the conductivity modulation in the p− layer 3.

When a p-channel type IGBT is turned off under a load L, a high negative voltage is applied to the drain electrode 9 due to the reverse electromotive force of the load L. The voltage is applied in the form of a reverse bias at the junction between the p− layer source and the n+ layer 4 and, as a result, a large electric field is generated at the junction Further, an npn transistor comprising the n+ substrate 1, p+ layer 2, p− layer 3 and n+ layer 4 tends to supply a constant current and the main current is attributable to the electron current. Since the impact ionization ratio of electrons upon applying at the junction a high electric field of about $10^{-5}$ V/cm is about 100 to 1000 times greater than that of the positive holes, avalanche breakdown tends to occur and prevents latch-up, as compared with an n-channel type IGBT which because of its parasitic thyristor depends on the withstand voltage for latch-up.

The object of the present invention is to overcome the foregoing disadvantages and provide a p-channel type IGBT which causes less avalanche breakdown upon turn-off.

SUMMARY OF THE INVENTION

To obtain the aforementioned object, there is provided a p-channel insulation gate type bipolar transistor having a first layer of high impurity concentration n-type substrate; a second layer of high impurity concentration p-type material disposed thereon, the thickness and specific resistivity of which is represented by $W_2$ and $\rho_2$, respectively; and a third layer of low impurity concentration p-type material disposed thereon, the thickness and specific resistivity of which is represented by $W_3$ and $\rho_3$, respectively. A first region of n-type material is selectively formed on the third layer, a second region of p-type material is selectively formed on the first region, and an insulation film is formed over the third layer, first region, and second region. A gate electrode is disposed upon the insulating film. The improvement of the present invention comprises the following parameter relationships:

$W_2$ is greater than 15 μm but less than 25 μm,
$\rho_2$ is greater than 0.1 ohm-cm but less than 0.4 ohm-cm
$W_3$ is greater than 50 μm but less than 250 μm,
$\rho_3$ is greater than 250 ohm-cm but less than 700 ohm-cm, $$A = (W_2^2/\rho_2) \ln(\rho_3 W_3) \times 10^{-3}$$

Avalanche breakdown is avoided at turn off voltages specified by any x value in a defined region of an x-y coordinate system by setting A equal to any corresponding y value within the defined region.

As an example in accordance with the present breakdown voltage $V_{CE} = -500$ V and a turn-on voltage $V_{on} < 3.0$ V, the variable A as defined above must be in the range $$2.4 \leq A \leq 19.8.$$

As a further example in accordance with the present invention, in order to avoid avalanche breakdown at a breakdown voltage $V_{CE} = -1000$ V and a turn-on voltage $V_{on} < 3.0$ V, the variable A as defined above must be in the range $$4.0 \leq A \leq 30.0.$$

As a still further example in accordance with the present invention, in order to avoid avalanche breakdown at a breakdown voltage $V_{CE} = -1250$ V and a turn-on voltage $V_{on} < 3.0$ V. the variable A as defined above must be in the range $$7.1 \leq A \leq 36.6.$$

The foregoing and other objects, features, and advantages of the invention will be apparent from the following more detailed description of the preferred embodiments of the invention, as illustrated in the accompanying drawing.

DESCRIPTION OF THE PREFERRED EMBODIMENT

The present invention, for attaining the foregoing object, concerns a p-channel insulation gate type bipolar transistor in which the first layer of high impurity concentration of n-type, the second layer of high impurity concentration and of p-type and the third layer of low impurity concentration of p-type are adjacently set in this order, the first region of n-type is selectively formed on the surface part of the third layer, the second region of p-type is selectively formed on the surface part of the first region, a gate electrode is provided on the first region put between the third layer and the second region via an insulation film, wherein the thickness of the second layer is greater than 15 μm but less than 25 μm, the specific resistivity of the second layer is greater than 0.1 ohm-cm but less than 0.4 ohm-cm, the thickness of the third layer is greater than 50 μm but less than 250 μm, the specific resistivity of the third layer is greater than 250 ohm-cm but less than 700 ohm-cm, and A is represented by:

$$W_2^2/\rho_2 \times \ln(\rho_3 \times W_3) \times 10^{-3}$$

where $W_2$ and $W_3$ respectively represent the thickness (μm) of the second layer and the third layer and $\rho_2$ and $\rho_3$ represent, respectively, the specific resistivity (ohm-cm) of the second layer and the third layer.

By making the specific resistivity of the third layer greater than 250 ohm-cm, the impurity concentration of the third layer is greatly reduced. Accordingly, when a reverse bias is applied to the third layer and the first region, since the voltage carried by the carriers is reduced, it is compensated by enlarging the depletion layer. With the arrangement described above, the electric field intensity between the junction is weakened, thereby causing less avalanche carriers upon applying an identical reverse bias as compared with the case where the third layer is a low specific resistivity layer having specific resistivity of less than 250 ohm-cm.

However, if the thickness of the second layer is reduced, the ground emitter current amplifying factor $h_{fe}$ of the npn transistor comprising the n-type first layer, p-type second and third layers, and n-type first region, is increased, and the ratio of the electron current is increased based on the entire current, thereby tending to cause avalanche breakdown. Accordingly, it is necessary to increase the thickness of the second layer to greater than 15 μm.

Figure 7:
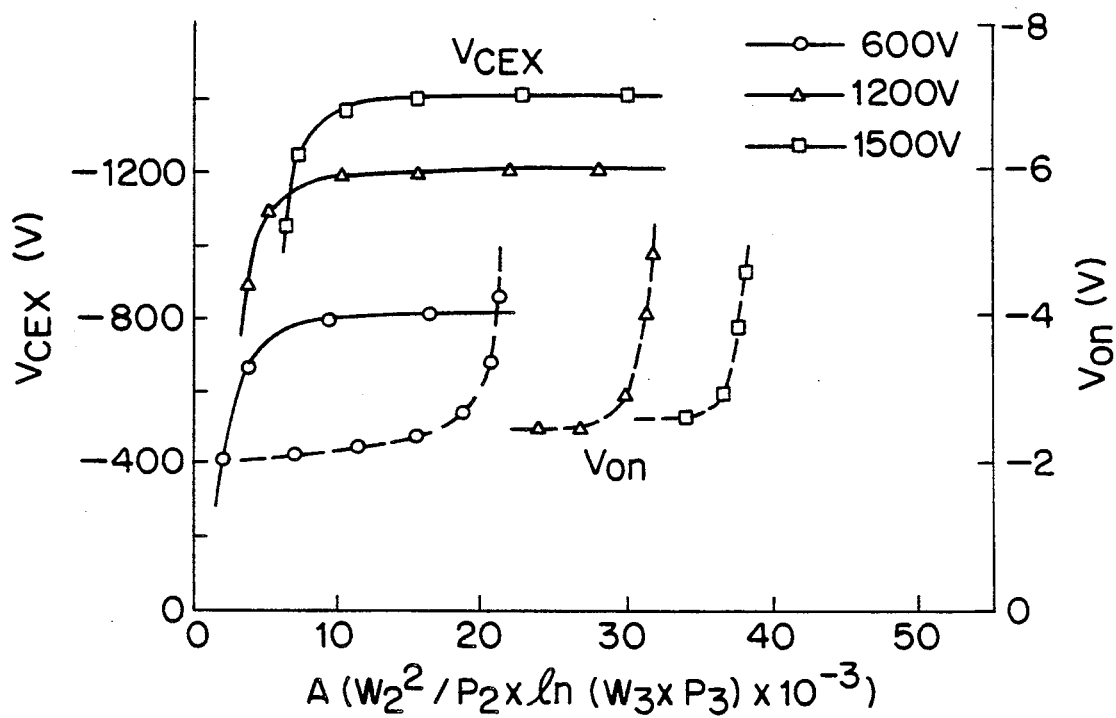
FIG. 7 is a graph showing the relationship between the secondary yield voltage and the turn on-voltage and the value A based on the present invention in each class of devices.

Further, the ground emitter current amplifying factor of the npn transistor depends also on the specific resistivity of the second layer and thickness of the third layer in addition to the thickness of the second layer and the specific resistivity of the third layer. For the dependency, when the value of A is represented by:

$$A = W_2^2/\rho_2 \times \ln(\rho_3 \times W_3) \times 10^{-3}$$

where $W_2$ represents the thickness of the second layer, $\rho_2$ represents the specific resistivity of the second layer, $W_3$ represents the thickness of the third layer and $\rho_3$ represents the specific resistivity of the third layer, is made greater than 2.4 at 450 V, greater than 4.0 at 900 V and greater than 7.1 at 1250 V of $V_{CEX}$, the ground emitter current amplifying factor of the npn transistor formed with the first layer, the second layer, the third layer and the first region is decreased to reduce the ratio of the electron current in the total current, thereby lessening the avalanche breakdown. However, since the on-voltage is increased as shown in FIG. 7 if the value of A is excessively great, it is kept to below 19.8 in a device at 450 V, below 30.0 in a device at 900 V and below 36.6 in the device at 1250 V of $V_{CEX}$.

Figure 1:
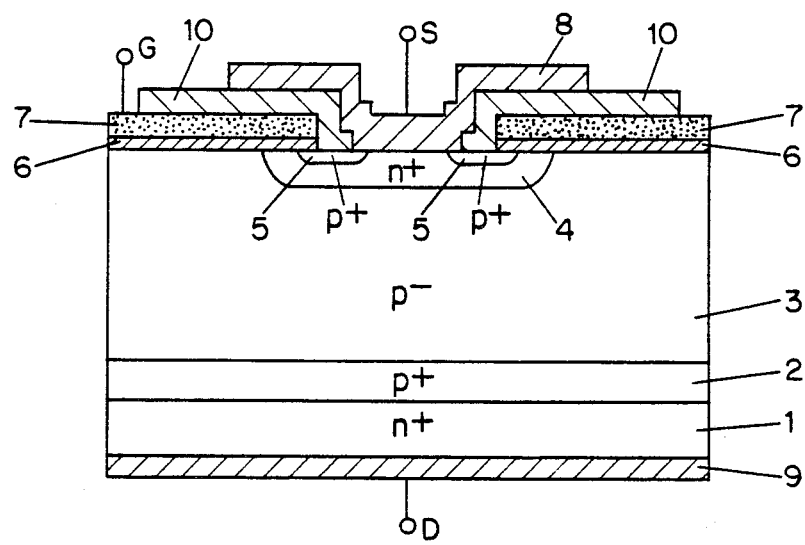
FIG. 1 is a cross sectional view of a p-channel type IGBT to which the present invention is applied.

The IGBT of the structure shown in FIG. 1 was manufactured by the method described below. At first, a p⁺ layer 2 and a p⁻ layer 3 are formed by means of an epitaxial method to the surface of an n⁺ substrate 1. After forming a gate oxide film 6 on the surface of the p⁺ layer 3, a gate electrode 7 comprising polycrystalline silicon was formed thereover and ion injection was applied for forming an n⁺ layer 4 using the gate electrode 7 as a mask. After thermally diffusing the n⁺ layer 4, a p⁺ layer 5 was formed by the ion injection and thermal diffusion also using the gate electrode 7 as a mask. Subsequently, they were covered with an insulation film 10, applied with patterning and then a source electrode 8 and a drain electrode 9 were formed to complete the device.

Figure 2:
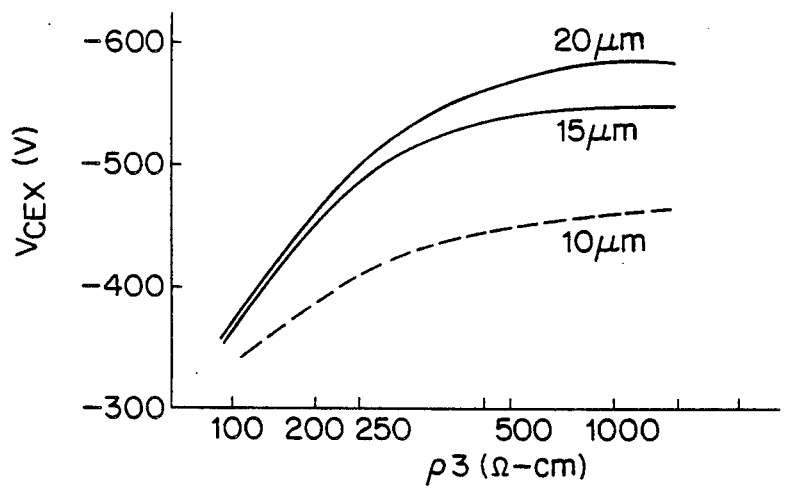
FIG. 2 is a graph of the relationship between the secondary yield voltage and the specific resistivity of the p− layer 3 in a 600 V class device.

In the thus manufactured p-channel type IGBT, the dependency of the secondary yield voltage $V_{CEX}$ on the specific resistivity $\rho_3$ of the p⁻ layer 3, with the thickness $W_2$ of the p⁺ layer 2 as a parameter is shown in FIG. 2. In this case, $V_{CEX}$ is the device breakdown voltage under load L turn-off. In this case, the specific resistivity $\rho_2$ of the p⁺ layer 2 was set to 0.3 ohm-cm and the thickness $W_3$ of the p⁻ layer 3 was set to 55 μm. Numerical values described in the figure show the thickness $W_2$ of the p⁺ layer 2 and it can be seen in any of the cases that $V_{CEX}$ is increased to cause less avalanche breakdown as the specific resistivity $\rho_3$ of the p⁻ layer 3 is higher. For avoiding the occurrence of avalanche breakdown upon load L turn-off under the conditions of: $V_{CEX} = -500$ V and $I_{CE} = -100$ A defined as the upper limit for the stable operation range upon current conduction in a 600 V class device used for 200 V type power source, it can be seen from FIG. 2 that the thickness $W_2$ of the p⁺ layer 2 has to be greater than 15 μm and the specific resistivity $\rho_3$ of the p⁻ layer 3 has to be greater than 250 ohm-cm.

Figure 3:
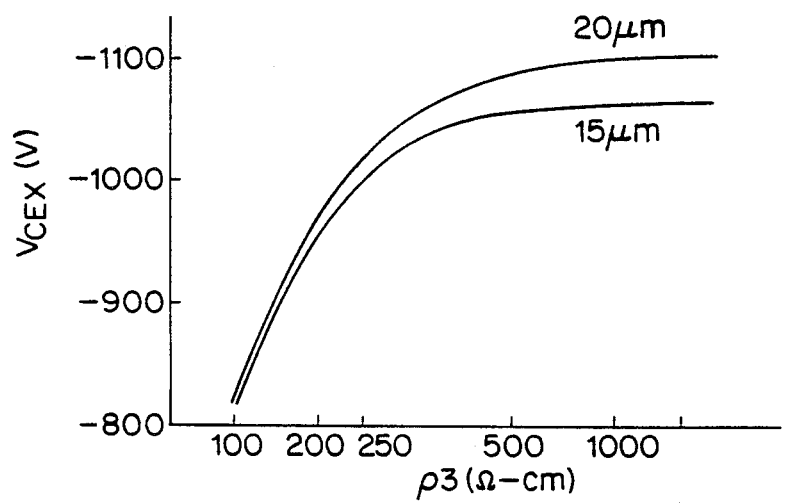
FIG. 3 is a graph of the relationship between the secondary yield voltage and the specific resistivity of the p⁻ layer 3 in a 1200 V class device.

FIG. 3 shows the dependency of $V_{CEX}$ on the specifice resistivity $\rho_3$ of the p⁻ layer 3 with the thickness $W_2$ of the p⁺ layer 2 as a parameter in a 1200 V class IGBT in which the thickness $W_3$ of the p⁻ layer 3 is increased to 78 μm. In this case, for the conditions of avoiding avalanche breakdown under the conditions of $V_{CE} = -1000$ V and $I_{CE} = -50$ A as the upper limit of the safe operating region of 1200 V class device, it can be seen from FIG. 3 that the thickness $W_2$ of the p⁺ layer 2 has to be greater than 15 μm and the specific resistivity $\rho_3$ of the p⁻ layer 3 has to be greater than 250 ohm-cm.

Figure 4:
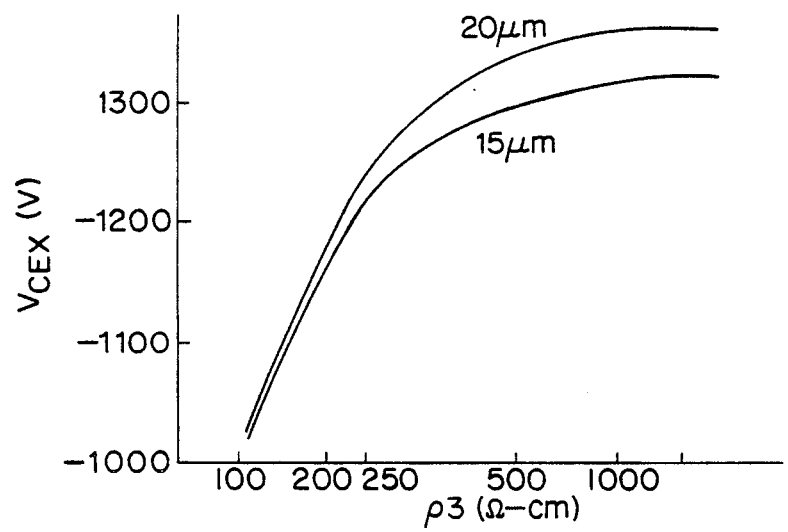
FIG. 4 is a graph of the relationship between the secondary yield voltage and the specific resistivity of the p⁻ layer 3 in a 1500 V class device.

FIG. 4 also shows the dependency of $V_{CEX}$ on the specific resistivity $\rho_3$ of the p⁻ layer 3 in a 1500 V class IGBT in which the thickness $W_3$ of the p⁻ layer 3 was further increased to 87 μm in the same manner with the thickness $W_2$ of the p⁺ layer 2 being the parameter. In this case, for the conditions of not causing avalanche breakdown at $V_{CE} = -1250$ V and $I_{CE} = -67$ A for the upper limit value for the safe operating region of a 1500 V class device, it can be seen from FIG. 4 that the thickness $W_2$ of the p⁺ layer 2 has to be greater than 15 μm and the specific resistivity $\rho_3$ of the p⁻ layer 3 has to be greater than 250 ohm-cm.

Figure 5:
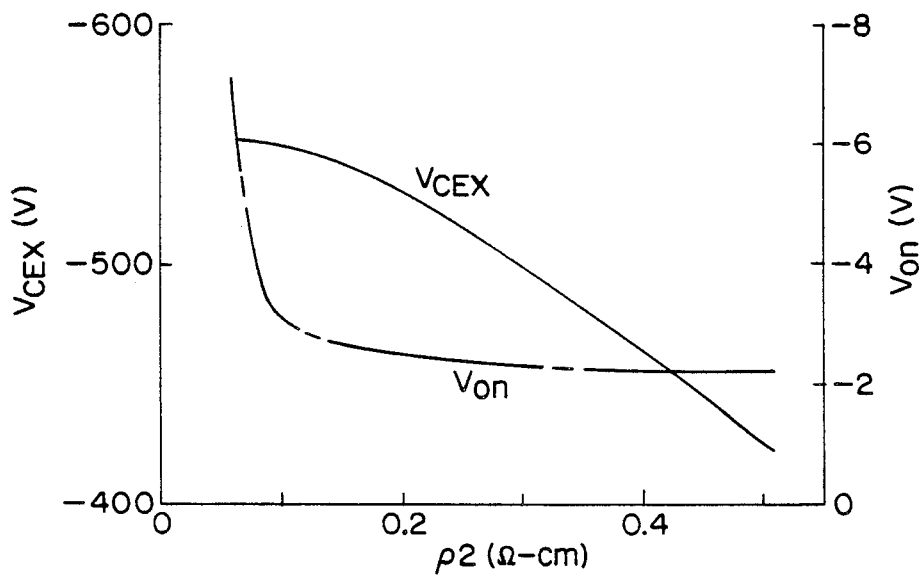
FIG. 5 is a graph of the relationship between the secondary yield voltage and the on-voltage, and the specific resistivity of the p⁺ layer 2 in a 600 V class device.

FIG. 5 shows the change of the secondary yield voltage $V_{CEX}$ when the specific resistivity $\rho_2$ of the p⁺ layer 2 was changed in a 600 V class device in which the specific resistivity $\rho_3$ of the p⁻ layer 3 is 300 ohm-cm and the thickness $W_2$ of the p⁺ layer 2 is 15 μm. As can be seen from the figure, $V_{CEX}$ greatly depends on the specific resistivity $\rho_2$ of the p⁺ layer 2 and $V_{CEX}$ increases as the specific resistivity $\rho_2$ decreases since the amplification factor $h_{fe}$ is smaller as the specific resistivity $\rho_2$ is lower. Therefore, it is preferred that $V_{CEX}$ be smaller. For example, it is selected so that the condition of avoiding avalanche breakdown at $V_{CE} = -450$ V is: the specific resistivity $\rho_2$ of the p⁺ layer 2 is less than 0.4 ohm-cm. FIG. 5 also shows the dependency of the on-voltage $V_{ON}$ on the specific resistivity $\rho_2$ of the p⁺ layer 2. The on-voltage means a potential drop upon rated current conduction of a device, that is, at $I_{CE} = 50$ A in a 500 V class device. As can be seen from FIG. 5, on-volta $V_{ON}$ shows a property contrary to that of $V_{CEX}$ and it is reduced as the specific resistivity is increased. Then, in order to satisfy the prescribed on-voltage value $V_{ON}$ of below 3.0 V in a general power device, it is necessary that the specific resistivity $\rho_2$ of the n⁺ layer 2 not be less than 0.1 ohm-cm.

Figure 6:
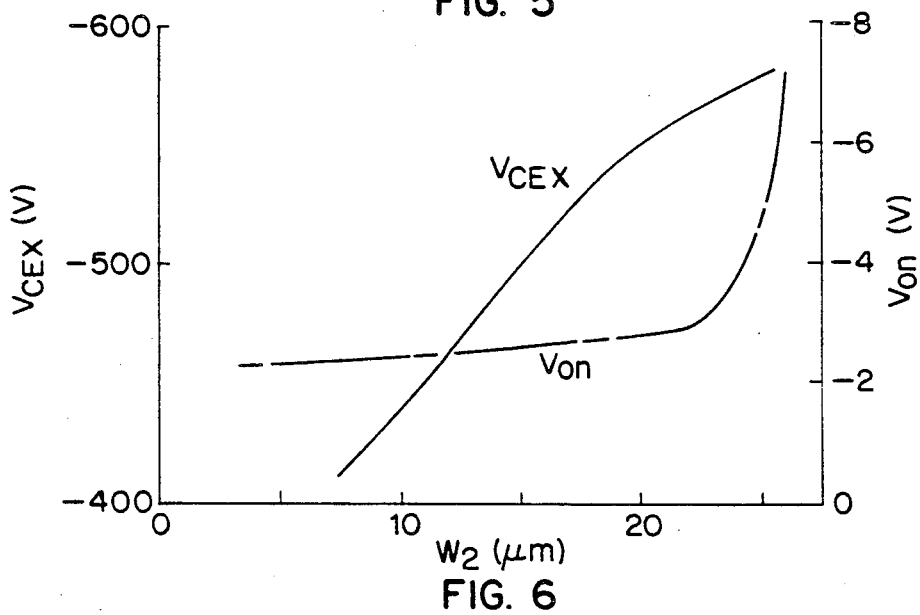
FIG. 6 is a graph of the relationship between the secondary yield voltage and the turn on-voltage, and the thickness of the p⁺ layer 2 in a 600 V class device.

FIG. 6 shows the change of $V_{CEX}$ when the thickness $W_2$ of the p⁺ layer 2 is changed in a 600 V class device in which the specific resistivity $\rho_3$ of the p⁻ 3 is 330 ohm-cm and the specific resistivity $\rho_2$ of the p⁺ layer 2 is 0.3 ohm-cm. The change of $V_{ON}$ with changes in $W_2$ is also shown in this figure. In the same relationship of the p⁺ layer 2 with the specific resistivity $\rho_2$, $V_{CEX}$ and $V_{ON}$ have characteristics contrary to each other as a function of the thickness $W_2$ of the p⁺ layer 2, in that $V_{CEX}$ is improved with an increase in the thickness $W_2$ of the p⁺ layer 2, whereas VON tends to be degraded. Then, in order to satisfy the condition of not causing avalanche breakdown at $V_{CE} = -500$ V it is necessary that the thickness $W_2$ of the p⁺ layer 2 not be less than 15 μm and in order to satisfy the condition of $V_{ON}$ being below 3.0 V it is necessary that the thickness be less than 25 μm.

Making the same evaluations as those in the previous example for the 1200 V and 1500 V class devices, it can be seen that $V_{ON}$ and $V_{CEX}$ are in a trade-off relationship in all of the devices. As can be seen from the foregoing example, it is apparent that the specific resistivity $\rho_2$ and the thickness $W_2$ of the p⁺ layer 2 and the specific resistivity $\rho_3$ and the thickness $W_3$ of the p⁻ layer 3 are the device parameters which have an effect on $V_{ON}$ and $V_{CEX}$.

Figure 9:
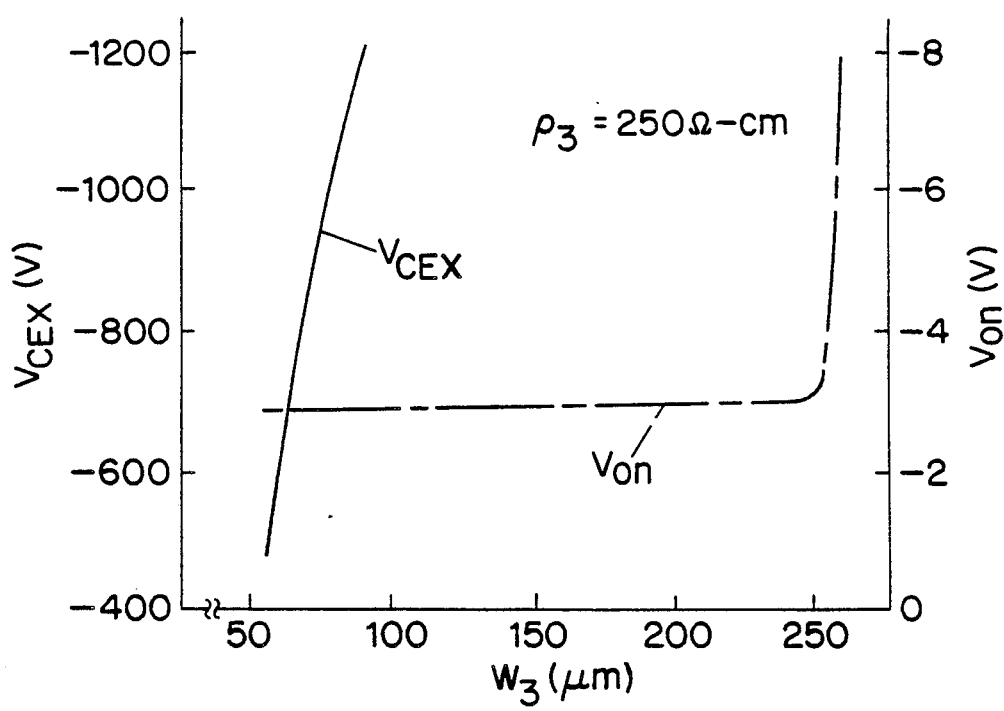
FIG. 9 is a graph showing a relationship between the secondary yield voltage and the on-voltage, and the thickness of the third layer.

FIG. 9 shows the relationship between $V_{CEX}$ and $V_{ON}$ and the thickness $W_3$ of the third layer 3 having a specific resistivity $\rho_3$ fixed at 250 ohm-cm, with $W_3$ presented on the abscissa and $V_{CEX}$ and $V_{ON}$ on the ordinate. The curves show that to obtain a $V_{CEX}$ higher than 450 V the thickness $W_3$ desirably is greater than 50 μm, and that to obtain $V_{ON}$ lower is already known from earlier discussion that for a layer 3 thickness $W_3$ greater than 50 μm but less than 250 μm the specific resistivity $\rho_3$ desirably is greater than 250 ohm-cm.

Figure 10:
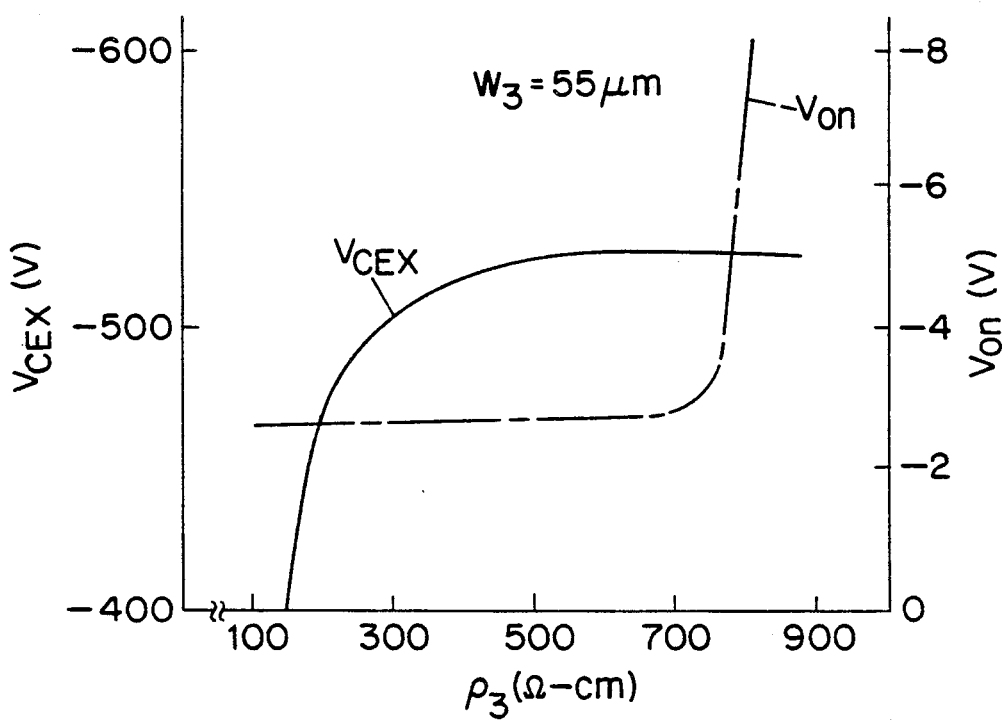
FIG. 10 is a graph showing a relationship between the secondary yield voltage and the on-voltage, and the specific resistivity of the third layer.

FIG. 10 shows the relationship between $V_{CEX}$ and $V_{ON}$ and the specific resistivity $\rho_3$ of the third layer 3 having a thickness $W_3$ fixed at 55 μm, with $\rho_3$ presented on the abscissa and $V_{CEX}$ and $V_{ON}$ on the ordinate. The curves show that to obtain a $V_{CEX}$ higher than 450 V the specific resistivity of layer 3 should be greater than 250 ohm-cm, and that to obtain $V_{ON}$ lower than 3.0 V the specific resistivity should be less than 700 ohm-cm. It is already known that a resistivity $\rho_3$ above 250 ohm-cm but less than 700 ohm-cm holds for any thickness $W_3$ in the range from 55 μm to 250 μm.

Using the foregoing four parameters the following equation is derived:

$$W_2^2/\rho_2 \times \ln(\rho_3 \times W_3) \times 10^{-3}$$

where
$W_2$: thickness of p⁺ layer 2 (μm)
$\rho_2$: specific resistivity of p⁺ layer 2 (ohm-cm)
$W_3$: thickness of p⁻ layer 3 (μm)
$\rho_3$: specific resistivity of p⁻ layer 3 (ohm-cm)

Figure 8:
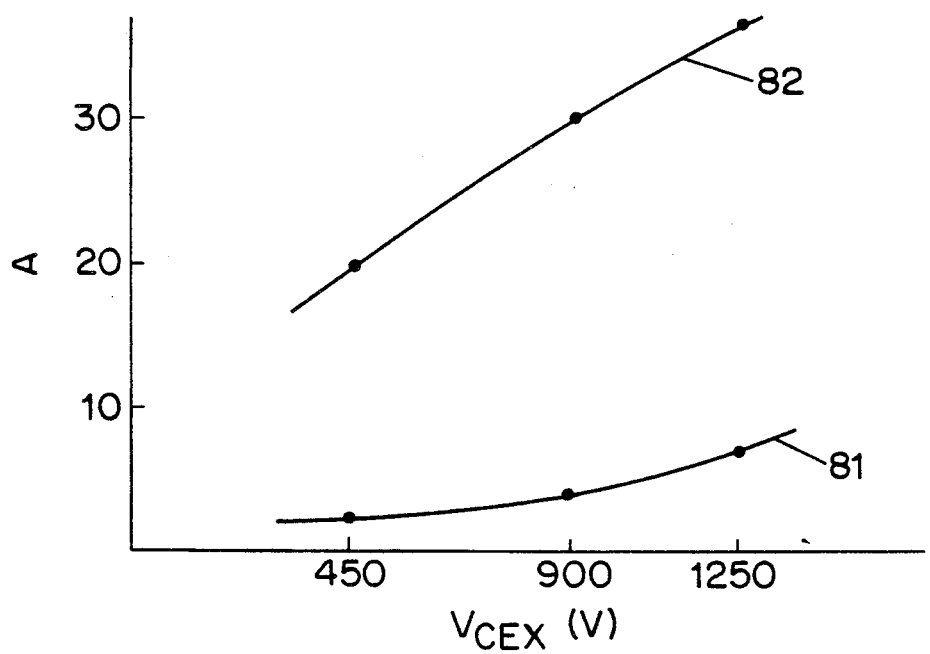
FIG. 8 is a graph showing a relationship between the upper and the lower limit values for the value A and the secondary yield voltage.

FIG. 7 shows the changes of $V_{CEX}$ and $V_{ON}$, presented on the ordinate as a function of the value A described above presented, on the abscissa for 600 V, 1200 V and 1500 V class p-channel type IGBTs. It can be seen that for the 600 V class device the conditions of not causing avalanche breakdown at $V_{CE} = -500$ V and $V_{ON}$ lower than 3.0 V can be satisfied in the case of: $2.4 \leq A \leq 19.8$. In the case of the 1200 V class device, it can be seen that the conditions of not causing avalanche breakdown at $V_{CE} = -1000$ V and $V_{ON}$ lower than 3.0 V can be satisfied in the case of $4.0 \leq A \leq 30.0$. In the case of the 1500 V class device, it is seen that the conditions of not causing avalanche breakdown at $V_{CE} = -1250$ V and $V_{ON}$ lower than 3.0 V can be satisfied in the case of $7.1 \leq A \leq 36.6$. FIG. 8 shows on the ordinate the range of values for the variable A while $V_{CEX}$ is presented on the abscissa. The variable A may have a value lying between the line 81 as the lower limit and the line 82 as the upper limit.

According to the present invention, a p-channel type IGBT capable of avoiding avalanche breakdown when a load is turned off is obtained by setting the specific resistivity of the highly resistant p-type third layer to be greater than 250 ohm-cm, and setting thickness of the second layer to be greater than 15 μm.

Many changes, modifications, variations and other uses and applications of the subject invention will become apparent to those skilled in the art after considering this specification and the accompanying drawing which discloses preferred embodiments thereof. All such changes, modifications, variations, and other uses and applications which do not depart from the spirit and scope of the invention are deemed to be covered by the invention which is limited only by the claims which follow.

I claim:

1. A p-channel insulation gate type bipolar transistor of the type containing a first layer of high impurity concentration n-type substrate; a second layer of high impurity concentration p-type material disposed on said first layer, the thickness of said second layer being represented by $W_2$; a third layer of low impurity concentration p-type material disposed on said second layer, the specific resistivity of said third layer being represented by $\rho_3$; a first region of n-type material selectively formed on said third layer; a second region of p-type material selectively formed on said first region; an insulation film formed over said third layer, said first region, and said second region; and a gate electrode disposed upon said insulating film; wherein the improvement comprises the following parameter relationships:

$W_2$ is greater than 15 $\mu$m, $\rho_3$ is greater than 250 ohm-cm.

2. A p-channel insulation gate type bipolar transistor of the type containing a first layer of high impurity concentration n-type substrate; a second layer of high impurity concentration p-type material disposed on said first layer, the thickness and specific resistivity of said second layer being represented by $W_2$ and $\rho_2$, respectively; a third layer of low impurity concentration p-type material disposed on said second layer, the thickness and specific resistivity of said third layer being represented by $W_3$ and $\rho_3$, respectively; a first region of n-type material selectively formed on said third layer; a second region of p-type material selectively formed on said first region; an insulation film formed over said third layer, said first region, and said second region; and a gate electrode disposed upon said insulating film; wherein the improvement comprises said second and third layers having the following parameters:

$W_2$ is greater than 15 $\mu$m but less than 25 $\mu$m $\rho_2$ is greater than 0.1 ohm-cm but less than 0.4 ohm-cm $W_3$ is greater than 50 $\mu$m but less than 250 $\mu$m $\rho_3$ is greater than 250 ohm-cm but less than 700 ohm-cm which are related to each other by the equation $$A = (W_2^2/\rho_2)\ln(\rho_3 W_3) \times 10^{-3}$$

3. A p-channel insulation gate type bipolar transistor as defined in claim 2 wherein A has a value within the range $$2.4 \leq A \leq 19.8$$

for avoiding avalanche breakdown at a breakdown voltage $V_{CE} = -500$ V and a turn-on voltage $V_{ON} < 3.0$ V.

4. A p-channel insulation gate type bipolar transistor as defined in claim 2 wherein A has a value within the range $$4.0 \leq A \leq 30.0$$

for avoiding avalanche breakdown at a breakdown voltage $V_{CE} = -1000$ V and a turn-on voltage $V_{ON} < 3.0$ V.

5. A p-channel insulation gate type bipolar transistor as defined in claim 2 wherein A has a value within the range $$7.1 \leq A \leq 36.6$$

for avoiding avalanche breakdown at a breakdown voltage $V_{CE} = -1250$ V and a turn-on voltage $V_{ON} < 3.0$ V.

* * * * *

UNITED STATES PATENT AND TRADEMARK OFFICE
CERTIFICATE OF CORRECTION

PATENT NO. : 5,072,265
DATED : December 10, 1991
INVENTOR(S) : Nuriyuki Iwamuro

It is certified that error appears in the above-identified patent and that said Letters Patent is hereby corrected as shown below:

Column 2, line 34, "present" should read --present invention, in order to avoid avalanche breakdown at a--;

Column 4, line 38, "p+ layer" should read --p⁻ layer--;

Column 5, lines 1-2, "specifice" should read --specific--;

Column 5, line 43, "on-volta" should read --on-voltage--;

Column 5, line 51, "p⁻ 3" should read --p⁻ layer 3--;

Column 6, line 13, "lower" should read --lower than 3.0 V the thickness $W_3$ desirably is less than 250 μm. It--;

Column 6, line 31, before the equation insert --A = --.

Signed and Sealed this

Twenty-fifth Day of May, 1993

Attest:

MICHAEL K. KIRK

*Attesting Officer*     *Acting Commissioner of Patents and Trademarks*